United States Patent
Saito et al.

(10) Patent No.: US 7,470,999 B2
(45) Date of Patent: Dec. 30, 2008

(54) GLASS FOR SEMICONDUCTOR ENCAPSULATION AND OUTER TUBE FOR SEMICONDUCTOR ENCAPSULATION, AND SEMICONDUCTOR ELECTRONIC PARTS

(75) Inventors: Kazuya Saito, Hikone (JP); Hajime Hikata, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 90 days.

(21) Appl. No.: 11/663,953

(22) PCT Filed: Sep. 29, 2005

(86) PCT No.: PCT/JP2005/017972

§ 371 (c)(1),
(2), (4) Date: Mar. 28, 2007

(87) PCT Pub. No.: WO2006/035882

PCT Pub. Date: Apr. 6, 2006

(65) Prior Publication Data

US 2008/0128923 A1 Jun. 5, 2008

(30) Foreign Application Priority Data

Sep. 29, 2004 (JP) ............................. 2004-285065

(51) Int. Cl.
*H01L 23/29* (2006.01)
(52) U.S. Cl. .............. 257/794; 257/E23.118; 501/55
(58) Field of Classification Search ............... 257/795, 257/E23.118
See application file for complete search history.

(56) References Cited

U.S. PATENT DOCUMENTS 6,063,718 A * 5/2000 El Khiati et al. .............. 501/70
2003/0124774 A1 * 7/2003 Kosokabe .................. 438/127

FOREIGN PATENT DOCUMENTS

JP 2-97435 4/1990

(Continued)

OTHER PUBLICATIONS

International Search Report for PCT/JP2005/017972 mailed Nov. 1, 2005.

*Primary Examiner*—Evan Pert
*Assistant Examiner*—Krista Soderholm
(74) *Attorney, Agent, or Firm*—Drinker Biddle & Reath LLP

(57) ABSTRACT

An object of the invention is to provide glass for semiconductor encapsulation and an outer tube for semiconductor encapsulation which are friendly to environment and allow semiconductor electronic parts to have a heat resistance of 700° C. or higher as normal maximum temperature, and semiconductor electronic parts. The glass for semiconductor encapsulation according to the invention contains essentially no lead and the temperature at which viscosity reaches $10^{10}$ dPa·s is 700° C. or higher. According to such a constitution, since the glass contains essentially no lead, no harmful ingredients are discharged in the production of the outer tube for semiconductor encapsulation and in the production of the semiconductor electronic parts and thus the glass is friendly to environment. Moreover, since the temperature at which viscosity reaches $10^{10}$ dPa·s is 700° C. or higher, semiconductor electronic parts such as a bead thermistor using the same has a heat resistance of 700° C. or higher as normal maximum temperature.

15 Claims, 2 Drawing Sheets

FOREIGN PATENT DOCUMENTS

| JP | 8-67534 | 3/1996 |
| JP | 8-78208 | 3/1996 |
| JP | 10-291833 | 11/1998 |
| JP | 2002-37641 | 2/2002 |

* cited by examiner (A)

(B)

US 7,470,999 B2

GLASS FOR SEMICONDUCTOR ENCAPSULATION AND OUTER TUBE FOR SEMICONDUCTOR ENCAPSULATION, AND SEMICONDUCTOR ELECTRONIC PARTS

This application is the U.S. national phase of International Application No. PCT/JP2005/17972 filed 29 Sep. 2005 which designated the U.S. and claims priority to JP 2004-285065 filed 29 Sep. 2004, the entire contents of each of which are hereby incorporated by reference.

TECHNICAL FIELD

The present invention relates to glass for semiconductor encapsulation to be used for encapsulating a semiconductor to prevent its deterioration, particularly glass for semiconductor encapsulation for encapsulating a semiconductor usable at a high temperature and an outer tube for semiconductor encapsulation, and semiconductor electronic parts.

BACKGROUND ART

A thermistor is one of semiconductor electronic parts and is known as a semiconductor electronic parts, which can determine temperature by measuring electric resistance utilizing a property (having a negative or positive temperature coefficient) that electric resistance of the semiconductor changes depending on increase in temperature.

Particularly, a thermistor 10 called a bead thermistor or a glass thermistor includes, as shown in FIG. 1, a semiconductor (thermistor chip) 1, a wire lead 2, and glass for semiconductor encapsulation 3 and the thermistor chip 1 and part of the wire lead 2 are covered and encapsulated by the glass for semiconductor encapsulation (glass for thermistor chip encapsulation) 3, the thermistor can be used at a high temperature and under an oxidative atmosphere. In this connection, as the thermistor chip 1, there are oxide-based materials and at least one non-oxide-based material selected from the group consisting of nitride, carbide, boride and silicide, but oxide-based materials have been widely used mainly in view of properties and price. Moreover, as the wire lead 2, Dumet wire (Ni—Fe alloy covered with Cu), platinum wire, and the like have been widely used.

For such glass for thermistor chip encapsulation, the following are required: (1) to have a sufficiently high volume resistivity in the operating temperature range so as not to influence electric resistance property of the thermistor chip; (2) to match a thermal expansion coefficient of the glass with those of the wire lead and the thermistor chip so that cracks do not generate at the time when the wire lead and the thermistor chip are encapsulated; (3) to be able to achieve encapsulation at a temperature lower than heat-resistant temperature of the wire lead and the thermistor chip.

Hitherto, as glass for thermistor chip encapsulation which satisfies such requirements, there have been proposed PbO—$SiO_2$—$B_2O_3$—$K_2O$-based high-lead-content glass (e.g., see Patent Document 1) and alkali borosilicate glass (e.g., see Patent Document 2).

Patent Document 1: JP-A-8-67534
Patent Document 2: JP-A-2002-37641

DISCLOSURE OF THE INVENTION

Problems that the Invention is to Solve

In recent years, environmental pollution by harmful ingredients, such as lead, cadmium, and arsenic, has been at issue. Thus, it has been required that industrial products be free of these harmful ingredients. Therefore, the glass described in Patent Document 1 cannot be employed from an environmental viewpoint since it contains a harmful ingredient, lead oxide in a large amount.

Moreover, from a standpoint of environmental measures for carbon dioxide reduction and acid rain prevention, it is required to maintain heat sources and combustion systems of power plants at an optimum operation state in order to minimize generation of $CO_2$ and $NO_x$. For maintaining optimum combustion state of gas, oil or the like of the heat sources and combustion systems, it is necessary to directly monitor and automatically control temperature of the combustion atmosphere. However, since the glass thermistor using the glass described in Patent Documents 1 or 2 has a low thermal resistance, it is impossible to use it in a combustion atmosphere where temperature reaches usually 500 to 600° C., and sometimes 700° C. or higher for the reasons that change in glass thickness resulting from a large degree of softening and deformation of the glass for encapsulation influences thermistor properties.

The present invention has been achieved in consideration of the above circumstances and an object thereof is to provide glass for semiconductor encapsulation and an outer tube for semiconductor encapsulation which are friendly to environment and allow semiconductor electronic parts to have a heat resistance of 700° C. or higher as normal maximum temperature, and semiconductor electronic parts.

Means for Solving the Problems

The glass for semiconductor encapsulation of the invention contains essentially no lead and the temperature at which viscosity reaches $10^{10}$ dPa·s is 700° C. or higher.

According to such a constitution, since the glass contains essentially no lead, no harmful ingredients are discharged in the production of the outer tube for semiconductor encapsulation and in the production of the semiconductor electronic parts and thus the glass is friendly to environment. Moreover, since the temperature at which viscosity reaches $10^{10}$ dPa·s is 700° C. or higher, a semiconductor electronic parts using the same, such as a bead thermistor has a heat resistance of 700° C. or higher as normal maximum temperature.

In this case, the heat resistance of the bead thermistor depends on the heat resistance of the glass for encapsulation and the heat resistance can be evaluated with the temperature at which viscosity reaches $10^{10}$ dPa·s. Namely, the temperature at which viscosity reaches $10^{10}$ dPa·s is a temperature at which glass is deformed only when an external force is imparted. Even when the glass is held at the temperature for a long period of time, edges of the glass are slightly softened and deformed but the shape can be maintained and the glass hardly reacts with the wire lead or the thermistor chip. Therefore, the temperature at which viscosity reaches $10^{10}$ dPa·s is about the same as normal maximum temperature of the bead thermistor. When the temperature at which viscosity reaches $10^{10}$ dPa·s is 800° C. or higher, a semiconductor electronic parts such as a bead thermistor using the same has a heat resistance of 800° C. or higher as normal maximum temperature.

Moreover, in the above constitution, a softening point (Ts) is preferably 800° C. or higher.

In this case, the semiconductor electronic parts such as a bead thermistor using the same can have a heat resistance of 800° C. or higher as maximum operating temperature.

Namely, the softening point is a temperature at which glass is slightly softened and deformed. When the glass is held at the temperature for a short period of time, edges of the glass are slightly softened and deformed but the shape can be maintained. When it is held at the temperature for a long period of time, thickness of the glass changes with change in shape of the glass, so that thermistor properties may be sometimes influenced. Therefore, the softening point is about the same as maximum operating temperature of the bead thermistor. When the softening point is 900° C. or higher, the semiconductor electronic parts such as a bead thermistor using the same has a heat resistance of 900° C. or higher as maximum operating temperature.

In this connection, the above-mentioned normal maximum temperature means a maximum temperature at which the properties are hardly deteriorated even when the thermistor is continued to use and the maximum operating temperature means a maximum temperature at which the thermistor is durable for use when the use is only for a short period of time.

In the above constitution, a strain point (Ps) is preferably 570° C. or higher.

In such a constitution, it is easy to obtain glass wherein the temperature at which viscosity reaches $10^{10}$ dPa·s is 700° C. or higher. Moreover, when the strain point is 640° C. or higher, it is easy to obtain glass wherein the temperature at which viscosity reaches $10^{10}$ dPa·s is 800° C. or higher, so that the case is more preferred.

In this case, the strain point is preferably 750° C. or lower. Namely, stress generated at the interface between the glass for encapsulation and the wire lead or the semiconductor such as the thermistor chip is proportional to the product of the difference in thermal expansion coefficient therebetween and the difference between the strain point and room temperature. Accordingly, the larger the difference between the strain point and room temperature is, the larger the above stress is. Therefore, when the strain point exceeds 750° C., an allowable difference in thermal expansion coefficient between the glass for encapsulation and the wire lead or the semiconductor such as the thermistor chip decreases. The strain point is more preferably 710° C. or lower.

In the above constitution, it is preferable that the temperature at which viscosity reaches $10^{11}$ dPa·s is 650° C. or higher, preferably 750° C. or higher.

In the above constitution, difference between the temperature at which the viscosity reaches $10^4$ dPa·s ($T(10^4)$) and the strain point (Ps) ($T(10^4)$–Ps) is preferably 350° C. or more.

In such a constitution, as methods for preparing an outer tube for encapsulation using the glass for semiconductor encapsulation, Danner method, Vello method, Down-Draw method, and Up-Draw method are suitable. In these methods, the production of an outer tube for encapsulation is facilitated. Namely, in the glass for semiconductor encapsulation, when ($T(10^4)$–Ps) is smaller than 350° C., viscosity of the glass widely changes in the case where the variation of forming temperature becomes large. Accordingly, it is difficult to produce an outer tube having a desired shape and as a result, there is a possibility that a yield ratio may decrease.

Moreover, in the case of producing a thermistor using the outer tube, when ($T(10^4)$–Ps) is 350° C. or more in the glass for semiconductor encapsulation, processing for encapsulation is facilitated in the semiconductor electronic parts such as a thermistor. Namely, in the glass for semiconductor encapsulation, when ($T(10^4)$–Ps) is smaller than 350° C., viscosity of the glass widely changes in the case where the variation of encapsulation temperature becomes large. Therefore, when a semiconductor such as a thermistor chip is melt-encapsulated by softening the outer tube, the shape of the glass for encapsulation tends to change. When thickness of the glass covering the semiconductor such as a thermistor chip is uneven, heat conduction also varies. Accordingly, properties of semiconductor electronic parts such as thermistor also varies and as a result, a yield ratio of the semiconductor electronic parts such as thermistor decreases. In particular, when ($T(10^4)$–Ps) is 500° C. or more, it becomes possible to increase index of processing for encapsulation (production amount per unit time) since the glass for encapsulation can be processed at a constant shape without deformation of the glass even when the variation of encapsulation temperature becomes large in the case that encapsulation temperature is raised to shorten encapsulation time. In this connection, a preferable range of ($T(10^4)$–Ps) is from 500 to 830° C. When ($T(10^4)$–Ps) exceeds 830° C., time required for solidification of the glass to such an extent that it does not deform is too much and hence production efficiency becomes worse, so that the case is not preferred.

Also, in the above constitution, an average thermal expansion coefficient in the temperature range of 30 to 380° C. is preferably from $60 \times 10^{-7}$ to $100 \times 10^{-7}/°$ C.

In such a constitution, the thermal expansion coefficient of the semiconductor such as thermistor chip or the wire lead becomes cross to that of the glass for encapsulation and hence cracks are hardly generated and thus the glass is hardly broken when the wire lead and the semiconductor such as thermistor chip are encapsulated. Moreover, in the case that the glass is not broken at the time of encapsulation, a strong strain may result in and there is a possibility of breakage when impact is applied during its use. A preferable range of the average thermal expansion coefficient is from $70 \times 10^{-7}$ to $90 \times 10^{-7}/°$ C.

In the above constitution, volume resistivity (Ωcm) at 500° C. is preferably 5 or more in terms of Log ρ.

In such a constitution, volume resistivity of the glass does not influence electric properties of the semiconductor such as thermistor chip. Namely, when volume resistivity (Ωcm) of the glass at 500° C. is lower than 5 in terms of Log ρ, electric current may slightly flow between the wire leads at the place where the semiconductor such as thermistor chip is not present and thus a circuit having a resistor is generated parallel to the semiconductor, thereby properties of the semiconductor electronic parts being changed.

Moreover, in the above constitution, the glass for encapsulation is preferably a highly acid-resistant glass which is not clouded on its surface after 1 hour of immersion in a 50% by mass aqueous sulfuric acid solution at 80° C. and has a weight reduction of 0.05 mg/cm² or less as compared with the weight before immersion.

In such a constitution, even when a thermistor using the same is used in a combustion atmosphere, the glass is hardly eroded by $NO_x$ or $SO_x$ gas and thus deterioration of the thermistor is not observed.

Furthermore, in the above constitution, the temperature at which viscosity reaches $10^{2.5}$ dPa·s is preferably 1600° C. or lower.

In such a constitution, melting temperature is not high, a large amount of combustion energy is not consumed, life of a melting furnace is lengthened, and also melting efficiency does not decrease.

Moreover, in the above constitution, the temperature at which viscosity reaches $10^4$ dPa·s is preferably 1400° C. or lower.

In such a constitution, encapsulation temperature is not higher than heat-resistant temperature of the wire lead (e.g., platinum wire, Ni-plated Dumet wire, Fe—Ni alloy wire, or the like) and also efficiency of processing for encapsulation does not decrease. Moreover, the glass wherein the temperature at which viscosity reaches $10^4$ dPa·s is 1400° C. or lower has a tendency that the temperature at which viscosity reaches $10^{10}$ dPa·s is 900° C. or lower and the softening point is 1000° C. or lower, so that it is possible for a bead thermistor to have heat resistance of 900° C. or lower as normal maximum temperature and of 1000° C. or lower as maximum operating temperature.

Furthermore, in the above constitution, liquid phase viscosity is preferably higher than $10^{4.3}$ dPa·s, more preferably higher than $10^{5.0}$ dPa·s.

In such a constitution, at the time when an outer tube for encapsulation is produced using Danner method, Vello method, Down-Draw method, or Up-Draw method, crystals are hardly deposited (hardly devitrified), so that the case is preferred. Namely, when crystals are deposited, viscosity of neighboring glass increases and dimensional accuracy of the outer tube tends to become worse.

Specifically, It is preferred that the glass for semiconductor encapsulation of the invention comprises: $SiO_2$ in an amount of from 40 to 80%; $Al_2O_3$ in an amount of from 1 to 20%; $B_2O_3$ in an amount of from 0 to 13%; MgO in an amount of from 0 to 10%; CaO in an amount of from 0 to 10%; SrO in an amount of from 0 to 20%; BaO in an amount of from 0 to 20%; ZnO in an amount of from 0 to 10%; $Na_2O$ in an amount of from 0 to 8%; $K_2O$ in an amount of from 0 to 18%; and at least one member selected from the group consisting of $ZrO_2$, $Nb_2O_5$, $WO_3$ and $Ta_2O_5$ in an amount of from 0 to 20%, said glass containing $Na_2O$ and $K_2O$ in a total amount of from 3 to 15% and at least one member selected from the group consisting of MgO, CaO, SrO, BaO and ZnO in an amount of from 0 to 40%, in terms of % by mass.

Moreover, it is more preferred that the glass for semiconductor encapsulation of the invention comprises: $SiO_2$ in an amount of from 50 to 80%; $Al_2O_3$ in an amount of from 1 to 20%; $B_2O_3$ in an amount of from 0 to 10%; MgO in an amount of from 0 to 8%; CaO in an amount of from 0 to 8%; SrO in an amount of from 0 to 20%; BaO in an amount of from 0 to 10%; ZnO in an amount of from 0 to 5%; $Na_2O$ in an amount of from 0 to 4%; and $K_2O$ in an amount of from 0 to 18%, said glass containing $Na_2O$ and $K_2O$ in a total amount of from 3 to 15%, at least one member selected from the group consisting of MgO, CaO, SrO, BaO and ZnO in an amount of from 0 to 40%, and at least one member selected from the group consisting of $ZrO_2$, $Nb_2O_5$, $WO_3$ and $Ta_2O_5$ in an amount of from 0.1 to 20%, in terms of % by mass.

In addition, it is further preferred that the glass for semiconductor encapsulation of the invention comprises: $SiO_2$ in an amount of from 50 to 70%; $Al_2O_3$ in an amount of from 1 to 10%; $B_2O_3$ in an amount of from 0 to 3%; MgO in an amount of from 0 to 8%; CaO in an amount of from 0 to 8%; SrO in an amount of from 4 to 20%; BaO in an amount of from 0 to 6%; ZnO in an amount of from 0 to 3%; $Na_2O$ in an amount of from 0 to 4%; and $K_2O$ in an amount of from 3 to 14%; said glass containing $Na_2O$ and $K_2O$ in a total amount of from 3 to 15%, at least one member selected from the group consisting of $ZrO_2$, $Nb_2O_5$, $WO_3$ and $Ta_2O_5$ in an amount of from 3 to 20%, and at least one member selected from the group consisting of MgO, CaO and SrO in an amount of from 4 to 20%, in terms of % by mass.

The reasons for restricting the content of each component as mentioned above are as follows.

$SiO_2$ is a network former and a component increasing the temperature at which viscosity reaches $10^{10}$ dPa·s and the strain point. The content thereof is from 40 to 80%, preferably from 50 to 80%, further preferably from 50 to 70%. When the content of $SiO_2$ is 40% or more, the glass is excellent in chemical resistance, particularly acid resistance. Moreover, when the content of $SiO_2$ is 80% or less, high-temperature viscosity is not too high and the thermal expansion coefficient of the glass matches with that of the wire lead or semiconductor, so that a good sealing can be achieved. Furthermore, when the content of $SiO_2$ is 50% or more, the temperature at which viscosity reaches $10^{10}$ dPa·s is hardly lowered from 700° C. and the strain point of the glass is hardly lowered from 570° C. and the glass is excellent in heat resistance, so that the case is preferred. When the content of $SiO_2$ is 70% or less, meltability is improved and also the glass is hardly devitrified and liquidus viscosity is improved, so that the case is preferred.

$Al_2O_3$ is a component increasing the temperature at which viscosity reaches $10^{10}$ dPa·s and the strain point and improving chemical resistance. The content thereof is from 1 to 20%, preferably from 1 to 10%. When the content of $Al_2O_3$ is 1% or more, the temperature at which viscosity reaches $10^{10}$ dPa·s tends to be 700° C. or higher and the strain point of the glass tends to be 570° C. or higher and the glass is excellent in heat resistance, the glass is not deformed nor eroded even at a high temperature and under an acidic atmosphere and thus excellent in heat resistance and acid resistance, so that the case is preferred. When the content of $Al_2O_3$ is 20% or less, the high-temperature viscosity of the glass hardly increases and solubility is improved. In particular, when the content of $Al_2O_3$ is 10% or less, the glass is hardly devitrified at the production of the outer tube, so that the case is preferred.

$B_2O_3$ has effects of lowering the high-temperature viscosity to enhance formability and meltability of the glass and increasing volume resistivity. The content thereof is 13% or less, preferably 10% or less, further preferably 3% or less, and particularly preferably, the glass does not essentially contain the same. When the content of $B_2O_3$ exceeds 13%, the strain point tends to be lowered from 570° C., so that the case is not preferred. When the content of $B_2O_3$ is 10% or less, the temperature at which viscosity reaches $10^{10}$ dPa·s is hardly lowered from 700° C. and the value of $T(10^4)$–Ps is hardly lowered from 350° C., so that the case is preferred. Furthermore, when the content of $B_2O_3$ is 3% or less, the glass is not deformed nor eroded even at a high temperature and under an acidic atmosphere such as exhaust gas, so that the case is preferred.

MgO and CaO are components which lower the high-temperature viscosity to enhance formability and meltability of the glass and elevate the temperature at which viscosity reaches $10^{10}$ dPa·s and the strain point. The content of each of them is from 0 to 10%, preferably from 0 to 8%. When the content of MgO or CaO is 10% or less, liquidus temperature is hardly elevated (liquidus viscosity is hardly lowered) and hence the production of the outer tube is facilitated. Moreover, when the content of MgO or CaO is 8% or less, chemical resistance is more improved, so that the case is particularly preferred.

SrO enhances formability and meltability of the glass with hardly lowering the temperature at which viscosity reaches $10^{10}$ dPa·s and the strain point. Moreover, it is a component allowing the glass to be hardly devitrified as compared with MgO and CaO. Particularly, when the glass contains $ZrO_2$ in an amount of 5% or more, there is an effect of suppressing deposition of crystals containing $ZrO_2$ (effect of lowering liquidus temperature) at forming, so that it is more preferred to incorporate SrO so that $SrO/ZrO_2$ becomes 1 or more. The content thereof is from 0 to 20%, preferably from 4 to 20%. When the content of SrO is 20% or less, the liquidus temperature is hardly elevated (liquidus viscosity is hardly lowered). Furthermore, when the content of SrO is 4% or more, the high-temperature viscosity is lowered and an effect of enhancing meltability is enhanced, so that the case is preferred.

BaO is a component which lowers the high-temperature viscosity to enhance formability and meltability of the glass and allows the glass to be hardly devitrified as compared with MgO and CaO and also is a component which lowers the temperature at which viscosity reaches $10^{10}$ dPa·s and the strain point. The content thereof is from 0 to 20%, preferably from 0 to 10%, more preferably from 0 to 6%. When the content of BaO is 20% or less, the glass is hardly devitrified and thereby forming is facilitated and a glass formed article having a high dimensional accuracy is obtained, so that the case is preferred. Moreover, when the content of BaO is 10% or less, the temperature at which viscosity reaches $10^{10}$ dPa·s is hardly lowered from 700° C. and the strain point is hardly lowered from 570° C., so that the case is preferred.

ZnO is a component which lowers viscosity of the glass to enhance formability and meltability of the glass. The content of ZnO is from 0 to 10%, preferably from 0 to 5%, further preferably from 0 to 3%. When the content of ZnO is 10% or less, the glass is hardly devitrified and when the content of ZnO is 5% or less, the strain point of the glass is hardly lowered from 570° C., so that the case is preferred. Furthermore, when the content of ZnO is 3% or less, the temperature at which viscosity reaches $10^{10}$ dPa·s is hardly lowered from 700° C., so that the case is preferred.

$Na_2O$ is a component which enhances thermal expansion coefficient of the glass and also enhances meltability of the glass, lowers encapsulation temperature, and improves processing ability since $Na_2O$ lowers viscosity of the glass. The content of $Na_2O$ is from 0 to 8%, preferably from 0 to 4%. When the content of $Na_2O$ is 8% or less, the strain point of the glass is hardly lowered from 570° C., so that the case is preferred. Furthermore, when the content of $Na_2O$ is 4% or less, the volume resistivity (Ωcm) at 500° C. tends to be 5 or more in terms of Log ρ, so that the case is preferred.

$K_2O$ is a component which enhances thermal expansion coefficient of the glass and also lowers viscosity of the glass although the lowering degree is not so much as in the case of $Na_2O$. In addition, $K_2O$ has a characteristic that it does not so much lower the volume resistivity as compared with $Na_2O$. The content thereof is from 0 to 18%, preferably from 3 to 14%. When the content of $K_2O$ is 18% or less, the temperature at which viscosity reaches $10^{10}$ dPa·s is hardly lowered from 700° C. and the strain point of the glass is hardly lowered from 570° C. Furthermore, when the content of $K_2O$ is 3% or more, the high-temperature viscosity is lowered and the meltability is enhanced, so that the case is preferred. When the content of $K_2O$ is 14% or less, chemical resistance of the glass is hardly lowered, so that the case is preferred.

$ZrO_2$, $Nb_2O_5$, $WO_3$ and $Ta_2O_5$ elevate the temperature at which viscosity reaches $10^{10}$ dPa·s and the strain point and also lower high-temperature viscosity of the glass to enhance the meltability. Particularly, $ZrO_2$ is a component which enhances chemical resistance of the glass. The content of at least member selected from the group consisting of $ZrO_2$, $Nb_2O_5$, $WO_3$ and $Ta_2O_5$ is from 0 to 20%. When the content of at least one member selected from the group consisting of $ZrO_2$, $Nb_2O_5$, $WO_3$ and $Ta_2O_5$ is 20% or less, the glass is hardly devitrified, so that the case is preferred. Moreover, a preferable range of the content of at least one member selected from the group consisting of $ZrO_2$, $Nb_2O_5$, $WO_3$ and $Ta_2O_5$ is from 0.01 to 20%, more preferably from 3 to 20%, and particularly preferably from 6 to 11%. When the content thereof is 0.01% or more, the temperature at which viscosity reaches $10^{10}$ dPa·s is hardly lowered from 700° C. and the strain point of the glass is hardly lowered from 570° C., so that the case is preferred. When the content thereof is 6% or more, the heat resistance is particularly high. A more preferable range of the content of $ZrO_2$ is from 3 to 20% and further preferably from 6 to 11%.

$P_2O_5$ has an effect of suppressing devitrification of the glass. The content thereof is from 0 to 3% and a preferable range is from 0.01 to 1%. When the content of $P_2O_5$ exceeds 3%, the glass generates phase separation and becomes opaque in the encapsulation step and thus it becomes difficult to find out defects in encapsulation at inspection of semiconductor electronic parts, so that the case is not preferred. Also, acid resistance of the glass tends to be lowered owing to the phase separation, so that the case is not preferred.

Moreover, $Na_2O$ or $K_2O$ which is an alkali metal oxide is an essential component for facilitating glass melting, lowering encapsulation temperature, and maintaining the thermal expansion coefficient at a high level. Therefore, the total amount of $Na_2O$ and $K_2O$ is preferably from 3 to 15%. Namely, when the total amount thereof is less than 3%, the thermal expansion coefficient is lowered from $60 \times 10^{-7}$/° C., so that the case is not preferred. Moreover, when the total amount thereof is more than 15%, the chemical resistance and electric insulating ability tend to become worse and the temperature at which viscosity reaches $10^{10}$ dPa·s tends to be lowered from 700° C. and the strain point of the glass tends to be lowered from 570° C., so that the case is not preferred. In this connection, $Li_2O$ may be incorporated in an amount of 5% or less. However, since the above effects are higher as compared with the cases of $Na_2O$ and $K_2O$ but it tends to deteriorate the chemical resistance and electric insulating ability, the glass more preferably contains essentially no $Li_2O$.

Furthermore, since MgO, CaO, SrO, BaO and ZnO elevate the thermal expansion coefficient and lower the high-temperature viscosity, they are components capable of increasing meltability of the glass, lowering encapsulation temperature, and facilitating processing for encapsulation. The content of at least one member selected from the group consisting of MgO, CaO, SrO, BaO and ZnO is preferably from 0 to 40%. When the content of at least one member selected from the group consisting of MgO, CaO, SrO, BaO and ZnO is 40% or less, the thermal expansion coefficient is hardly enhanced from $90 \times 10^{-7}$/° C., so that the case is preferred. Particularly, MgO, CaO, and SrO are components which elevate the temperature at which viscosity reaches $10^{10}$ dPa·s and the strain point of the glass. When the content of at least one member selected from the group consisting of MgO, CaO and SrO is 4% or more, the temperature at which viscosity reaches $10^{10}$ dPa·s is hardly lowered from 700° C. and the strain point of the glass is hardly lowered from 570° C., so that the case is preferred. When the content thereof is 20% or less, the glass is hardly devitrified and forming is facilitated, so that the case is also preferred.

In addition, $Al_2O_3/(Na_2O+K_2O)$ is preferably 0.35 or more in terms of % by mass. As mentioned above, $Al_2O_3$ is a component increasing the temperature at which viscosity reaches $10^{10}$ dPa·s and the strain point and improving acid resistance. To the contrary, $Na_2O$ and $K_2O$ are components lowering the temperature at which viscosity reaches $10^{10}$ dPa·s and the strain point and deteriorating acid resistance. Therefore, when $Al_2O_3/(Na_2O+K_2O)$ is 0.35 or more, the temperature at which viscosity of the glass for encapsulation reaches $10^{10}$ dPa·s tends to be 700° C. or higher, the strain point of the glass tends to be 570° C. or higher, and acid resistance is hardly lowered, so that the case is preferred. A preferable range of $Al_2O_3/(Na_2O+K_2O)$ is from 0.4 to 6.

Moreover, other than the above, for the purpose of controlling viscosity of the glass and improving chemical resistance, meltability, refining ability, and the like, it is possible to add components such as $SnO_2$, $SO_3$, $Sb_2O_3$, F and Cl each in an amount of 3% or less in terms of oxide. In this connection, As$_2$O$_3$ also has a refining effect but its addition is not preferred from an environmental viewpoint. TiO$_2$ is a component enhancing chemical resistance and may be incorporated in an amount of 10% or less.

Furthermore, when an Fe$^{2+}$ ion increases in the glass, the glass tends to absorb an infrared ray and temperature of the glass is needlessly elevated, so that the temperature cannot be correctly measured and thus the case is not preferred. For such a reason, the content of Fe$_2$O$_3$ is preferably 2% or less and particularly, Fe$^{2+}$/total Fe (mass ratio) is preferably 0.4 or less. In order to control Fe$^{2+}$/total Fe (mass ratio) to 0.4 or less, it is convenient to melt the glass in an oxidative atmosphere.

In addition, the outer tube for semiconductor encapsulation of the invention comprises the glass for semiconductor encapsulation possessing any constitution as mentioned above.

Such an outer tube for semiconductor encapsulation is friendly to the environment and a semiconductor electronic parts produced using the same can have heat resistance of 700° C. or higher as normal maximum temperature. Furthermore, since acid resistance and volume resistivity of the glass are high and matching in thermal expansion coefficient with the wire lead and semiconductor is excellent, an excellent high-temperature type thermistor can be produced, which is capable of measuring a temperature of 700° C. or higher in common use.

Moreover, the semiconductor electronic parts of the invention comprises a semiconductor, a wire lead, and glass for semiconductor encapsulation for covering and encapsulating the semiconductor and part of the wire lead, wherein the glass for semiconductor encapsulation comprises the glass for semiconductor encapsulation possessing any constitution as mentioned above.

Such a semiconductor electronic parts is friendly to the environment and can have heat resistance of 700° C. or higher as normal maximum temperature. Furthermore, since acid resistance and volume resistivity of the glass are high and matching in thermal expansion coefficient with the wire lead and semiconductor is excellent, the parts may be an excellent high-temperature type thermistor, which is capable of measuring a temperature of 700° C. or higher in common use.

The following will describe a process for producing the outer tube for semiconductor encapsulation comprising the glass for semiconductor encapsulation according to the invention.

The process for producing the outer tube in an industrial scale includes a mixing and blending step wherein minerals and purified crystal powders containing components forming the glass are measured and mixed and raw materials to be charged into a furnace are blended, a melting step wherein the raw materials are melted and vitrified, a forming step wherein the melted glass is formed into a tube shape, and a processing step wherein the tube is cut into a predetermined size.

First, glass raw materials are blended. The raw materials include minerals containing a plurality of components such as oxides and carbonates and impurities. They may be blended in consideration of analytical data and the raw materials are not restricted. These are weighted and mixed in an appropriate mixer according to a scale, such as a V mixer, a rocking mixer, a mixer fitted with mixing blades, to obtain a charging raw material.

Then, the raw material is charged into a glass-melting furnace and vitrified. The melting furnace includes a melter tank for melting and vitrifying the glass raw material, a refiner for removing bubbles in the glass, and a feeder for lowering viscosity of the refined glass to an appropriate degree for forming and feeding it into a forming apparatus. As the melting furnace, a furnace inside of which is covered with refractory or platinum is used, which is heated by burner or by electrification into the glass. The charged raw material is vitrified in a melter usually at 1300° C. to 1600° C. and then is transferred into a refiner at 1400° C. to 1600° C. In the refiner, the bubbles in the glass are allowed to come to the surface to remove the bubbles. The glass discharged from the refiner is cooled during the transfer into the forming apparatus through the feeder and its viscosity becomes 10$^4$ to 10$^6$ dPa·s which is suitable for forming the glass.

Then, the glass is formed into a tubular form by a forming apparatus. As forming methods, Danner method, Vello method, Down-Draw method, and Up-Draw method are applicable.

Thereafter, an outer tube for semiconductor encapsulation can be obtained by cutting the glass tube into a predetermined size. For cutting processing of the glass tube, it is possible to cut the tube one by one with a diamond cutter but, as a suitable method for mass production, there is commonly used a method of bonding a large number of the glass tubes into one article and cutting it with a diamond wheel cutter to cut a large number of the glass tubes at once.

The following will describe a method of encapsulating a semiconductor element using the outer tube comprising the glass of the invention.

First, electrode materials such as Dumet wires or platinum wires are set using a jig so that a semiconductor element are held between the materials from both sides in the outer tube. Thereafter, the whole is heated at a temperature of 1400° C. or lower to soften and deform the outer tube, whereby the element is air-tightly encapsulated. In such a manner, a small-size electronic parts such as silicon diode, light-emitting diode, or thermistor can be produced.

In this connection, in addition to the use as a glass tube, the glass for semiconductor encapsulation can be pulverized to form a paste and a semiconductor element can be encapsulated by sintering the glass with wrapping the paste around the semiconductor element.

Advantage of the Invention

As mentioned above, since the glass for semiconductor encapsulation of the invention contains essentially no lead and the temperature at which viscosity reaches 10$^{10}$ dPa·s is 700° C. or higher, it is friendly to the environment and the semiconductor electronic parts produced using the same can have a heat resistance of 700° C. or higher as normal maximum temperature.

Figure 1:
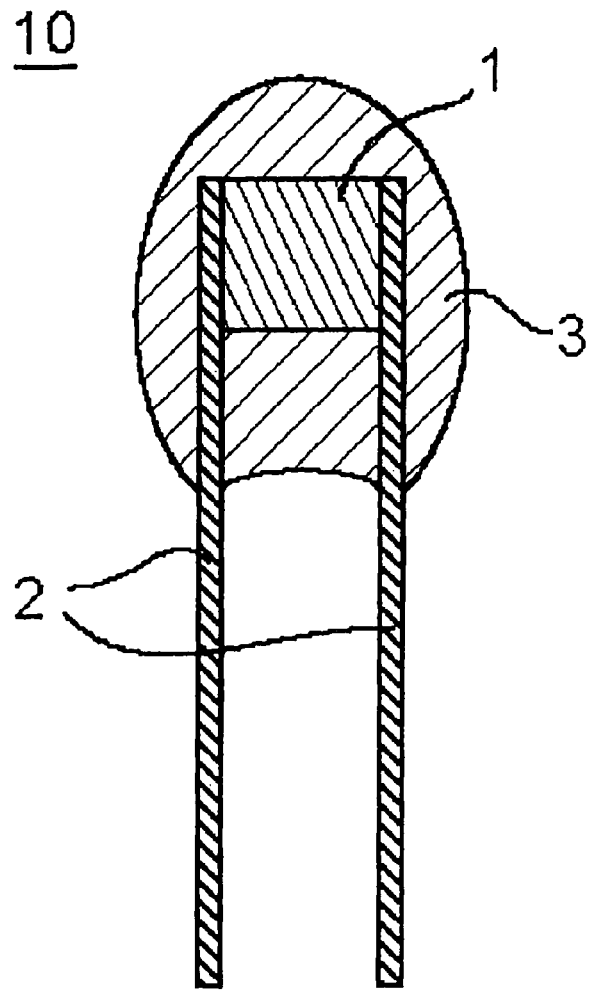
FIG. 1 is an explanatory drawing showing conventional and inventive thermistor.

DESCRIPTION OF REFERENCE NUMERALS AND SIGNS 1 semiconductor (thermistor chip)
2 wire lead
3 glass for semiconductor encapsulation (glass for thermistor chip encapsulation)
10 thermistor
21 cylindrical glass 21' glass after thermal treatment
22 platinum wire
23 refractory

BEST MODE FOR CARRYING OUT THE INVENTION

The following will explain the invention in detail with reference to Examples.

Examples

Table 1 shows Examples 1 to 5 of the invention, Table 2 shows Examples 6 to 9, Table 3 shows Examples 10 to 14, Table 4 shows Examples 15 to 19, and Table 5 shows Examples 20 to 23 and Comparative Example.

First, stone powder, aluminum oxide, boric acid, magnesium oxide, calcium carbonate, strontium carbonate, barium carbonate, zinc oxide, lithium carbonate, sodium carbonate, potassium carbonate, potassium nitrate, zirconium oxide, niobium oxide, tungsten oxide, tantalum oxide, phosphate salts, sodium chloride, sodium sulfate, antimony oxide, and stannic oxide were blended so as to be predetermined ratios in consideration of yield ratios and amounts of impurities, followed by thorough mixing in a mixer.

The resulting raw material was melted in a glass-melting furnace at 1500° C. to 1600° C. and formed into a tubular form by Down-Draw method. Thereafter, it was cut and a glass tube having an appropriate length (e.g., 1 m) was obtained. In the case of an outer tube for a bead thermistor, inner diameter of the tube is from 0.6 to 2.1 mm and the thickness is from 0.2 to 0.8 mm. The inner diameter and thickness of the tube was controlled by falling speed of the glass, air pressure, and drawing speed. Then, several hundreds to several thousands of the above-mentioned glass tubes were bound at once with a resin and collectively cut into a length of 1 mm to 4 mm. Finally, the resin was removed and the tubes were separated into pieces to obtain glass outer tubes.

Moreover, on each sample, the thermal expansion coefficient, the density, the strain point, the temperatures at which viscosity reaches $10^{10}$ dPa·s, $10^4$ dPa·s and $10^{2.5}$ dPa·s, the softening point, the temperature subtracting strain point from temperature at which the viscosity reaches $10^4$ dPa·s, ($T(10^4)$–Ps), and the volume resistivity at 500° C. were measured. These results are shown in each table.

TABLE 1

| (% by mass) | Example 1 | Example 2 | Example 3 | Example 4 | Example 5 |
|---|---|---|---|---|---|
| $SiO_2$ | 64.2 | 55.8 | 62.7 | 60.0 | 62.1 |
| $Al_2O_3$ | 8.0 | 6.9 | 7.2 | 7.0 | 7.4 |
| $B_2O_3$ | — | — | — | 3.0 | — |
| MgO | 3.7 | 3.4 | — | — | 1.2 |
| CaO | 3.3 | 4.1 | 3.9 | 4.1 | 2.8 |
| SrO | 6.7 | 8.0 | 9.7 | 9.7 | 7.7 |
| BaO | 2.6 | 5.0 | 0.1 | 0.2 | 0.3 |
| ZnO | — | 2.0 | — | — | — |
| $Na_2O$ | 0.7 | 3.5 | 0.5 | 0.5 | 0.3 |
| $K_2O$ | 7.0 | 8.0 | 10.5 | 10.3 | 9.5 |
| $ZrO_2$ | 3.5 | 3.0 | 5.0 | 4.8 | 8.0 |
| $P_2O_5$ | 0.1 | 0.1 | 0.2 | 0.2 | 0.5 |
| Cl | — | 0.1 | — | — | — |
| $SO_3$ | 0.2 | 0.1 | 0.1 | 0.1 | — |
| $Sb_2O_3$ | — | — | 0.1 | — | 0.2 |
| $SnO_2$ | — | — | — | 0.1 | — |
| $Na_2O + K_2O$ | 7.7 | 11.5 | 11.0 | 10.8 | 9.8 |
| MgO + CaO + SrO + BaO + ZnO | 16.3 | 22.5 | 13.7 | 14.0 | 12.0 |
| MgO + CaO + SrO | 13.7 | 15.5 | 13.6 | 13.8 | 11.7 |
| $Al_2O_3/(Na_2O + K_2O)$ | 1.04 | 0.60 | 0.65 | 0.65 | 0.76 |
| Theremal expansion coefficient ($\times 10^{-7}$/° C.) | 60.5 | 82.3 | 70.9 | 69.9 | 62.2 |
| Density (g/cm$^3$) | 2.612 | 2.720 | 2.634 | 2.632 | 2.650 |
| Strain point (° C.) | 678 | 596 | 668 | 631 | 703 |
| Temperature at which viscosity reaches $10^{11}$ dPa · s (° C.) | 786 | 704 | 788 | 755 | 818 |
| Temperature at which viscosity reaches $10^{10}$ dPa · s (° C.) | 826 | 741 | 829 | 798 | 858 |
| Softening point (° C.) | 952 | 851 | 944 | 927 | 980 |
| Temperature at which viscosity reaches $10^4$ dPa · s (° C.) | 1310 | 1131 | 1295 | 1250 | 1350 |
| Temperature at which viscosity reaches $10^{2.5}$ dPa · s (° C.) | 1590 | 1498 | 1574 | 1544 | 1594 |
| $T(10^4)$-Ps (° C.) | 632 | 535 | 627 | 619 | 647 |
| Liquidus temperature (° C.) | 1193 | 1043 | 1180 | 1125 | 1244 |
| Log liquidus viscosity | 4.9 | 4.8 | 4.9 | 5.1 | 4.8 |
| Volume resistivity Log ρ (500° C.) | 5.4 | No Data | No Data | No Data | No Data |
| Heat resistance | ◯ | ◯ | ◯ | ◯ | ◯ |
| Acid resistance | ◯ | No Data | No Data | No Data | ◯ |

TABLE 2

| (% by mass) | Example 6 | Example 7 | Example 8 | Example 9 |
|---|---|---|---|---|
| $SiO_2$ | 64.3 | 69.0 | 75.8 | 60.7 |
| $Al_2O_3$ | 5.8 | 11.0 | 4.8 | 6.9 |
| $B_2O_3$ | — | — | — | — |
| MgO | 1.8 | — | — | 3.7 |
| CaO | 2.3 | — | — | 3.3 |
| SrO | 4.7 | 4.6 | 3.1 | 6.7 |
| BaO | 5.6 | — | 2.2 | 2.6 |
| ZnO | 5.0 | — | — | — |
| $Na_2O$ | 4.7 | 4.9 | — | 0.7 |
| $K_2O$ | 5.6 | 9.6 | 13.4 | 11.5 |
| $ZrO_2$ | — | — | 0.5 | 3.5 |
| $P_2O_5$ | — | 0.7 | — | 0.2 |
| $SO_3$ | 0.2 | — | — | — |
| $Sb_2O_3$ | — | — | 0.2 | 0.1 |
| $SnO_2$ | — | 0.2 | — | 0.1 |
| $Na_2O + K_2O$ | 10.3 | 14.5 | 13.4 | 12.2 |
| MgO + CaO + SrO + BaO + ZnO | 19.4 | 4.6 | 5.3 | 16.3 |
| MgO + CaO + SrO | 8.8 | 4.6 | 3.1 | 13.7 |
| $Al_2O_3/(Na_2O + K_2O)$ | 0.56 | 0.76 | 0.36 | 0.57 |
| Theremal expansion coefficient ($\times 10^{-7}/°C$) | 72.1 | 74.4 | 63.9 | 75.4 |
| Density ($g/cm^3$) | 2.585 | 2.448 | 2.382 | 2.633 |
| Strain point (° C.) | 571 | 575 | 587 | 642 |
| Temperature at which viscosity reaches $10^{11}$ dPa·s (° C.) | 705 | 724 | 734 | 766 |
| Temperature at which viscosity reaches $10^{10}$ dPa·s (° C.) | 737 | 780 | 792 | 805 |
| Softening point (° C.) | 865 | 950 | 971 | 922 |
| Temperature at which viscosity reaches $10^4$ dPa·s (° C.) | 1187 | 1324 | 1383 | 1253 |
| Temperature at which viscosity reaches $10^{2.5}$ dPa·s (° C.) | 1502 | 1540 | 1588 | 1537 |
| $T(10^4)$-Ps (° C.) | 616 | 749 | 796 | 611 |
| Liquidus temperature (° C.) | No Data | 1226 | 1265 | 1094 |
| Log liquidus viscosity | No Data | 4.8 | 4.9 | 5.3 |
| Volume resistivity Log ρ (500° C.) | No Data | No Data | No Data | 6.1 |
| Heat resistance | ◯ | ◯ | ◯ | ◯ |
| Acid resistance | No Data | ◯ | ◯ | ◯ |

TABLE 3

| (% by mass) | Example 10 | Example 11 | Example 12 | Example 13 | Example 14 |
|---|---|---|---|---|---|
| $SiO_2$ | 61.9 | 57.1 | 54.1 | 61.4 | 59.9 |
| $Al_2O_3$ | 6.9 | 6.9 | 6.9 | 6.9 | 6.9 |
| $B_2O_3$ | — | — | 3.0 | — | — |
| MgO | 5.7 | — | — | 3.7 | 3.7 |
| CaO | 3.3 | 6.3 | 6.3 | 3.3 | 3.3 |
| SrO | 6.7 | 9.7 | 9.7 | 6.7 | 6.7 |
| BaO | 0.6 | 0.1 | 0.1 | 2.6 | 2.6 |
| ZnO | — | — | — | — | 2.0 |
| $Na_2O$ | 0.7 | 0.7 | 0.7 | 0.7 | 0.7 |
| $K_2O$ | 10.5 | 10.5 | 10.5 | 10.5 | 10.5 |
| $ZrO_2$ | 3.5 | 8.5 | 8.5 | 3.5 | 3.5 |
| $P_2O_5$ | — | — | — | 0.5 | — |
| Cl | — | 0.1 | — | — | — |
| $SO_3$ | 0.2 | 0.1 | — | — | — |
| $Sb_2O_3$ | — | — | 0.2 | 0.1 | 0.1 |
| $SnO_2$ | — | — | — | 0.1 | 0.1 |
| $Na_2O + K_2O$ | 11.2 | 11.2 | 11.2 | 11.2 | 11.2 |
| MgO + CaO + SrO + BaO + ZnO | 16.3 | 16.1 | 16.1 | 16.3 | 18.3 |
| MgO + CaO + SrO | 15.7 | 16.1 | 16.0 | 13.7 | 13.7 |
| $Al_2O_3/(Na_2O + K_2O)$ | 0.62 | 0.62 | 0.62 | 0.62 | 0.62 |
| Theremal expansion coefficient ($\times 10^{-7}/°C$) | 71.4 | 74.5 | 73.8 | 72.6 | 73.5 |
| Density ($g/cm^3$) | 2.609 | 2.744 | 2.742 | 2.628 | 2.670 |
| Strain point (° C.) | 652 | 695 | 658 | 649 | 641 |
| Temperature at which viscosity reaches $10^{11}$ dPa·s (° C.) | 772 | 810 | 771 | 772 | 762 |
| Temperature at which viscosity reaches $10^{10}$ dPa·s (° C.) | 812 | 846 | 808 | 813 | 800 |
| Softening point (° C.) | 926 | 950 | 911 | 931 | 917 |
| Temperature at which viscosity reaches $10^4$ dPa·s (° C.) | 1248 | 1247 | 1202 | 1262 | 1239 |
| Temperature at which viscosity reaches $10^{2.5}$ dPa·s (° C.) | 1530 | 1508 | 1453 | 1557 | 1518 |
| $T(10^4)$-Ps (° C.) | 596 | 552 | 544 | 613 | 599 |
| Liquidus temperature (° C.) | 1165 | 1189 | 1142 | 1110 | 1121 |
| Log liquidus viscosity | 4.7 | 4.5 | 4.5 | 5.3 | 5.0 |
| Volume resistivity Log ρ (500° C.) | No Data | No Data | No Data | No Data | No Data |
| Heat resistance | ◯ | ◯ | ◯ | ◯ | ◯ |
| Acid resistance | No Data | No Data | No Data | ◯ | No Data |

TABLE 4

| (% by mass) | Example 15 | Example 16 | Example 17 | Example 18 | Example 19 |
|---|---|---|---|---|---|
| $SiO_2$ | 56.7 | 56.7 | 54.7 | 55.8 | 55.7 |
| $Al_2O_3$ | 6.9 | 8.9 | 6.9 | 6.9 | 6.9 |
| MgO | 2.0 | 2.0 | 2.0 | 2.0 | 2.0 |
| CaO | — | — | — | — | — |
| SrO | 10.7 | 10.7 | 10.7 | 10.7 | 10.7 |
| BaO | 2.6 | 2.6 | 2.6 | 2.6 | 2.6 |
| ZnO | — | — | — | — | — |
| $Na_2O$ | 0.7 | 0.7 | 0.7 | 0.7 | 0.7 |
| $K_2O$ | 11.5 | 11.5 | 11.5 | 11.5 | 11.5 |
| $ZrO_2$ | 8.5 | 6.5 | 8.5 | 8.5 | 8.5 |
| $P_2O_5$ | 0.2 | 0.2 | 0.2 | 0.2 | 0.2 |
| $Nb_2O_5$ | — | — | 2.0 | — | — |
| $WO_3$ | — | — | — | 1.0 | — |
| $Ta_2O_5$ | — | — | — | — | 1.0 |
| Cl | — | — | — | — | 0.1 |
| $SO_3$ | — | — | 0.2 | 0.1 | 0.1 |
| $Sb_2O_3$ | — | 0.2 | — | — | — |
| $SnO_2$ | 0.2 | — | — | — | — |
| $Na_2O + K_2O$ | 12.2 | 12.2 | 12.2 | 12.2 | 12.2 |
| $MgO + CaO + SrO + BaO + ZnO$ | 15.3 | 15.3 | 15.3 | 15.3 | 15.3 |
| $MgO + CaO + SrO$ | 12.7 | 12.7 | 12.7 | 12.7 | 12.7 |
| $Al_2O_3/(Na_2O + K_2O)$ | 0.57 | 0.73 | 0.57 | 0.57 | 0.57 |
| Theremal expansion coefficient ($\times 10^{-7}/°$ C.) | 73.8 | 74.7 | 74.0 | 73.5 | 73.2 |
| Density (g/cm³) | 2.748 | 2.715 | 2.790 | 2.773 | 2.778 |
| Strain point (° C.) | 691 | 686 | 697 | 694 | 696 |
| Temperature at which viscosity reaches $10^{11}$ dPa·s (° C.) | 815 | 812 | 819 | 816 | 821 |
| Temperature at which viscosity reaches $10^{10}$ dPa·s (° C.) | 856 | 853 | 858 | 857 | 862 |
| Softening point (° C.) | 971 | 971 | 968 | 971 | 976 |
| Temperature at which viscosity reaches $10^4$ dPa·s (° C.) | 1291 | 1303 | 1274 | 1282 | 1288 |
| Temperature at which viscosity reaches $10^{2.5}$ dPa·s (° C.) | 1564 | 1586 | 1530 | 1542 | 1550 |
| $T(10^4)$-Ps (° C.) | 600 | 617 | 577 | 588 | 592 |
| Liquidus temperature (° C.) | impossible to measure | impossible to measure | impossible to measure | impossible to measure | impossible to measure |
| Log liquidus viscosity | impossible to measure | impossible to measure | impossible to measure | impossible to measure | impossible to measure |
| Volume resistivity Log ρ (500° C.) | 6.4 | No Data | No Data | No Data | No Data |
| Heat resistance | ○ | ○ | ○ | ○ | ○ |
| Acid resistance | ○ | No Data | No Data | No Data | No Data |

TABLE 5

| (% by mass) | Example 20 | Example 21 | Example 22 | Example 23 | Comparative Example |
|---|---|---|---|---|---|
| $SiO_2$ | 56.7 | 66.5 | 62.8 | 54.5 | 43.1 |
| $Al_2O_3$ | 6.9 | 3.7 | 7.9 | 7.1 | 3.0 |
| $B_2O_3$ | — | — | — | — | 15.0 |
| MgO | 2.0 | 6.5 | 3.6 | 1.9 | 2.5 |
| CaO | — | 0.1 | 2.5 | 2.1 | — |
| SrO | 10.7 | 13.2 | 6.5 | 8.9 | 5.6 |
| BaO | 2.6 | 0.1 | 0.1 | 8.5 | 11.0 |
| ZnO | — | — | — | — | 5.5 |
| $Li_2O$ | — | — | — | — | 3.4 |
| $Na_2O$ | 0.7 | 3.2 | 2.4 | 5.3 | — |
| $K_2O$ | 11.5 | 6.0 | 12.5 | 7.0 | 10.6 |
| $ZrO_2$ | — | 0.5 | 0.5 | 4.6 | — |
| $P_2O_5$ | 0.2 | — | 1.0 | — | — |
| $Ta_2O_5$ | 8.5 | — | — | — | — |
| Cl | — | 0.1 | — | — | — |
| $SO_3$ | — | 0.1 | 0.2 | 0.1 | — |
| $Sb_2O_3$ | 0.2 | — | — | — | 0.3 |
| $Na_2O + K_2O$ | 12.2 | 9.2 | 14.9 | 12.3 | 10.6 |
| $MgO + CaO + SrO + BaO + ZnO$ | 15.3 | 19.9 | 12.7 | 21.4 | 24.6 |
| $MgO + CaO + SrO$ | 12.7 | 19.8 | 12.6 | 12.9 | 8.1 |

TABLE 5-continued

| (% by mass) | Example 20 | Example 21 | Example 22 | Example 23 | Comparative Example |
|---|---|---|---|---|---|
| $Al_2O_3/(Na_2O + K_2O)$ | 0.57 | 0.40 | 0.53 | 0.58 | 0.28 |
| Thermal expansion coefficient ($\times 10^{-7}/°$ C.) | 77.2 | 73.1 | 84.7 | 87.9 | 88.0 |
| Density (g/cm³) | 2.782 | 2.626 | 2.533 | 2.830 | 2.858 |
| Strain point (° C.) | 641 | 588 | 591 | 572 | 475 |
| Temperature at which viscosity reaches $10^{11}$ dPa·s (° C.) | 763 | 700 | 711 | 680 | 530 |
| Temperature at which viscosity reaches $10^{10}$ dPa·s (° C.) | 803 | 738 | 753 | 717 | 559 |
| Softening point (° C.) | 918 | 850 | 880 | 825 | 628 |
| Temperature at which viscosity reaches $10^4$ dPa·s (° C.) | 1255 | 1181 | 1227 | 1132 | 794 |
| Temperature at which viscosity reaches $10^{2.5}$ dPa·s (° C.) | 1547 | 1487 | 1555 | 1408 | 947 |
| $T(10^4)$-Ps (° C.) | 614 | 593 | 636 | 560 | 319 |
| Liquidus temperature (° C.) | 1164 | 1050 | 1136 | 1010 | 822 |
| Log liquidus viscosity | 4.7 | 5.1 | 4.7 | 5.1 | 3.7 |
| Volume resistivity Log ρ (500° C.) | No Data | No Data | No Data | No Data | No Data |
| Heat resistance | ○ | ○ | ○ | ○ | X |
| Acid resistance | No Data | No Data | No Data | No Data | X |

As is apparent from Tables, in each of Examples 1 to 23 of the invention, the strain point was 570° C. or higher and the temperature at which viscosity reaches $10^{10}$ dPa·s was 700° C. or higher, so that the products were excellent in heat resistance and were suitable for a 700° C. heat-resistant high-temperature type thermistor. Furthermore, the thermal expansion coefficient, the softening point, the temperature at which the viscosity reaches $10^4$ dPa·s, the temperature at which the viscosity reaches $10^{2.5}$ dPa·s, $T(10^4)$–Ps, and the volume resistivity at 500° C. satisfied required properties. In this connection, in each Example and Comparative Example, the content of $Fe_2O_3$ was from 150 to 250 ppm.

On the other hand, in Comparative Example, the thermal expansion coefficient and the temperatures at which the viscosity reaches $10^4$ dPa·s and $10^{2.5}$ dPa·s satisfied required properties but the acid resistance was low and the temperature at which the viscosity reaches $10^{10}$ dPa·s and the strain point were low and thus heat resistance was poor, so that it was confirmed that the case was not suitable for a 700° C. heat-resistant high-temperature type thermistor.

In this connection, at the evaluation of properties on each sample, glass raw materials were first blended so as to be the composition shown in Table and melted in the range of 1500° C. to 1600° C. for 6 hours using a platinum crucible. Then, the melt was formed and processed into a predetermined shape, which was then subjected to each evaluation.

With regard to the thermal expansion coefficient, after the glass is processed into a cylinder having a diameter of about 5 mm and a length of about 20 mm, an average thermal expansion coefficient in the temperature range of 30 to 380° C. is measured on an automatic differential dilatometer.

The density was measured by Archimedes method.

The strain point, the temperatures at which the viscosity reaches $10^{10}$ dPa·s, the softening point, the temperatures at which the viscosity reach $10^4$ dPa·s and $10^{2.5}$ dPa·s were determined as follows. First, the strain point and the softening point were measured by a fiber method in accordance with ASTM C338 and the temperatures at which the viscosity reaches $10^4$ dPa·s and $10^{2.5}$ dPa·s were measured by a platinum-ball pulling-up method. Then, these temperatures and the value of viscosity were applied to Fullcher equation to calculate the temperature at which the viscosity reaches $10^{10}$ dPa·s and the temperature at which the viscosity reaches $10^{11}$ dPa·s.

With regard to the liquidus temperature, the glass pulverized into particles having a particle diameter of about 0.1 mm was placed in a boat-shape platinum vessel and was held in a temperature-gradient furnace for 24 hours. Thereafter, the glass was taken out and observed on a microscope and temperature at which an initial phase of crystals was generated was determined as the temperature. In this connection, in Examples 15 to 19, no crystals were observed and thus it is impossible to measure the liquidus temperature (liquidus viscosity).

The liquidus viscosity was calculated based on the above viscosity of the glass and the liquidus temperature.

The volume resistivity at 500° C. was measured by the method in accordance with ASTM C657.

Figure 2:
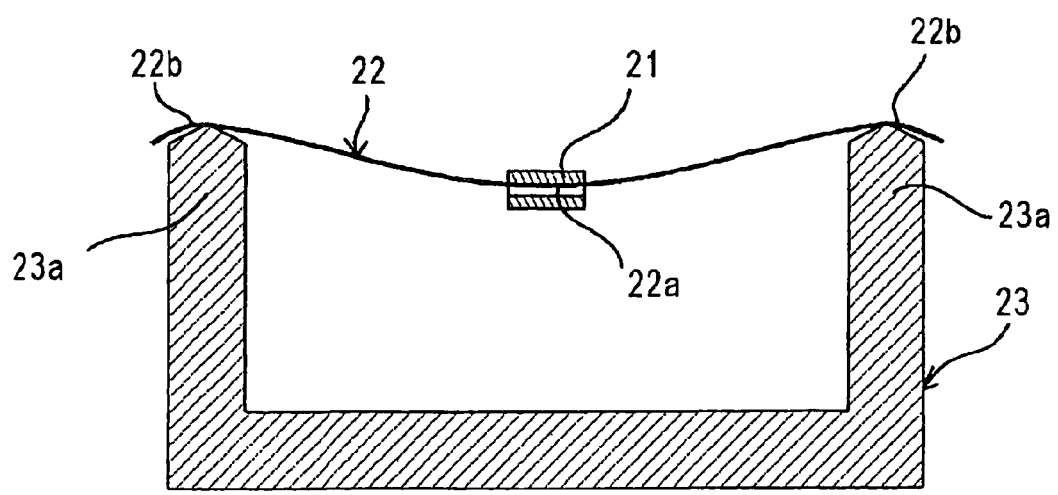
FIG. 2 is a schematic explanatory drawing of a heat resistance-evaluating method.
Figure 3:
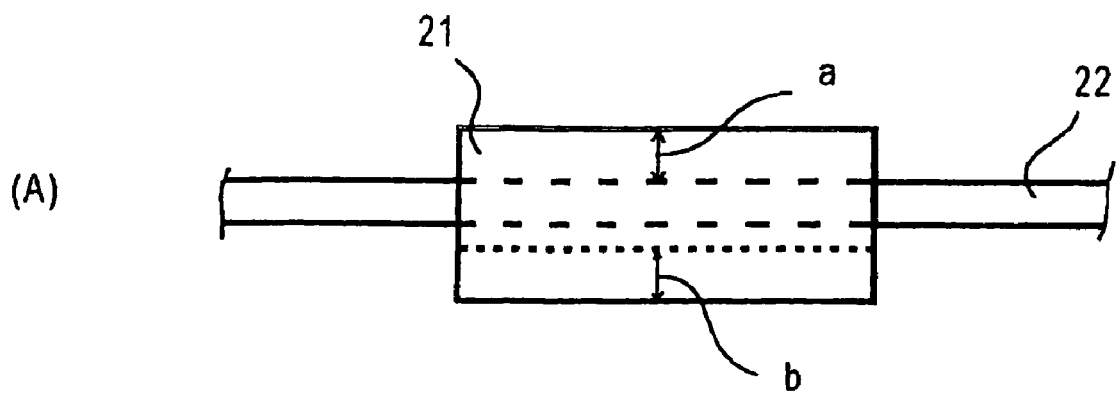
FIG. 3 shows shapes of a glass in the heat resistance-evaluating method, (A) showing a shape of the glass before thermal treatment and (B) showing a shape of the glass after thermal treatment.
Figure 3:
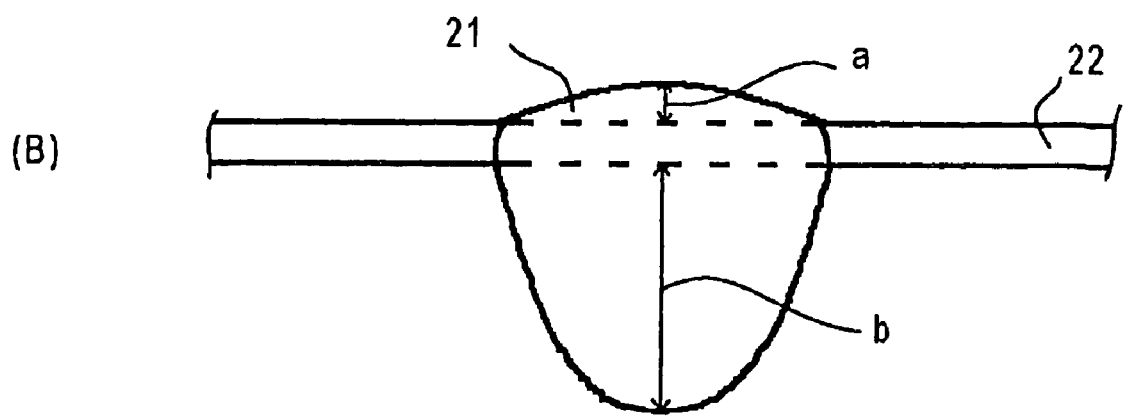

With regard to the heat resistance, a platinum wire 22 having a diameter of 0.5 mmφ was put through an inner hole of a cylindrical glass 21 having an outer diameter of 2 mmφ, an inner diameter of 0.8 mmφ, and a length of 5 mm; the glass was held at almost central part 22a of the platinum wire 22 deformed as shown in FIG. 2; both ends 22b of the platinum wire 22 were placed on protruded parts 23a of a refractory 23, and the whole was charged into an electric furnace at 800° C. and subjected to thermal treatment for 1 hour. Since the cylindrical glass 21 before thermal treatment is even in thickness as shown in FIG. 3A, a/b equals 1.0. However, when subjected to thermal treatment, as shown in FIG. 3B, it is softened and deformed and a maximum thickness b attached to a lower part of the platinum wire 22 becomes larger than a maximum thickness a attached to an upper part of the platinum wire 22. In the glass 21' after thermal treatment under the above conditions, the case of a/b≧0.7 was represented by "O" where the heat resistance was excellent and the case of a/b<0.7 was represented by "X" where the heat resistance was poor.

With regard to the acid resistance, after the outer tube for encapsulation was immersed in a 50% by mass aqueous sulfuric acid solution at 80° C. for 1 hour, the case that the surface was not at all clouded and mass reduction was 0.05 mg/cm² or less as compared with the mass before immersion was represented by "O" where acid resistance was evaluated to be excellent and the case that cloudiness was generated on the surface or cloudiness was not generated on the surface but mass reduction exceeded 0.05 mg/cm² as compared with the mass before immersion was represented by "X" where acid resistance was evaluated to be poor.

INDUSTRIAL APPLICABILITY

As mentioned above, since the glass for semiconductor encapsulation according to the invention is friendly to the environment and the semiconductor electronic parts has a heat resistance of 700° C. or higher as normal maximum temperature, it is suitable for a thermistor, especially a high-temperature type thermistor.

Moreover, since the semiconductor electronic parts of the invention is friendly to the environment and has a heat resistance of 700° C. or higher as normal maximum temperature, it can be suitably used as a thermistor for measuring temperature of engines of automobiles and the like, boilers, and the like.

The invention claimed is:

1. A glass for semiconductor encapsulation, which contains essentially no lead, wherein a temperature at which viscosity reaches $10^{10}$ dPa·s is 700° C. or higher.

2. The glass for semiconductor encapsulation according to claim 1, which has a softening point (Ts) of 800° C. or higher.

3. The glass for semiconductor encapsulation according to claim 1, which has a strain point (Ps) of 570° C. or higher.

4. The glass for semiconductor encapsulation according to claim 1, wherein the difference between a temperature at which viscosity reaches $10^4$ dPa·s and the strain point ($T(10^4)$–Ps) is 350° C. or more.

5. The glass for semiconductor encapsulation according to claim 1, which has an average thermal expansion coefficient in the temperature range of 30 to 380° C. of from $60 \times 10^{-7}$ to $100 \times 10^{-7}$/° C.

6. The glass for semiconductor encapsulation according to claim 1, which has an average thermal expansion coefficient in the temperature range of 30 to 380° C. of from $70 \times 10^{-7}$ to $90 \times 10^{-7}$/° C.

7. The glass for semiconductor encapsulation according to claim 1, which has a volume resistivity (Ωcm) at 500° C. of 5 or more in terms of Log ρ.

8. The glass for semiconductor encapsulation according to claim 1, comprising:
    $SiO_2$ in an amount of from 40 to 80%;
    $Al_2O_3$ in an amount of from 1 to 20%;
    $B_2O_3$ in an amount of from 0 to 13%;
    MgO in an amount of from 0 to 10%;
    CaO in an amount of from 0 to 10%;
    SrO in an amount of from 0 to 20%;
    BaO in an amount of from 0 to 20%;
    ZnO in an amount of from 0 to 10%;
    $Na_2O$ in an amount of from 0 to 8%;
    $K_2O$ in an amount of from 0 to 18%; and
    at least one member selected from the group consisting of $ZrO_2$, $Nb_2O_5$, $WO_3$ and $Ta_2O_5$ in an amount of from 0 to 20%,
    said glass containing $Na_2O$ and $K_2O$ in a total amount of from 3 to 15% and at least one member selected from the group consisting of MgO, CaO, SrO, BaO and ZnO in an amount of from 0 to 40%, in terms of % by mass.

9. The glass for semiconductor encapsulation according to claim 8, which contains at least one member selected from the group consisting of $ZrO_2$, $Nb_2O_5$, $WO_3$ and $Ta_2O_5$ in an amount of from 0.01 to 20% in terms of % by mass.

10. The glass for semiconductor encapsulation according to claim 8, comprising:
    $SiO_2$ in an amount of from 50 to 80%;
    $Al_2O_3$ in an amount of from 1 to 20%;
    $B_2O_3$ in an amount of from 0 to 10%;
    MgO in an amount of from 0 to 8%;
    CaO in an amount of from 0 to 8%;
    SrO in an amount of from 0 to 20%;
    BaO in an amount of from 0 to 10%;
    ZnO in an amount of from 0 to 5%;
    $Na_2O$ in an amount of from 0 to 4%; and
    $K_2O$ in an amount of from 0 to 18%,
    said glass containing $Na_2O$ and $K_2O$ in a total amount of from 3 to 15%, at least one member selected from the group consisting of MgO, CaO, SrO, BaO and ZnO in an amount of from 0 to 40%, and at least one member selected from the group consisting of $ZrO_2$, $Nb_2O_5$, $WO_3$ and $Ta_2O_5$ in an amount of from 0.1 to 20%, in terms of % by mass.

11. The glass for semiconductor encapsulation according to claim 8, comprising:
    $SiO_2$ in an amount of from 50 to 70%;
    $Al_2O_3$ in an amount of from 1 to 10%;
    $B_2O_3$ in an amount of from 0 to 3%;
    MgO in an amount of from 0 to 8%;
    CaO in an amount of from 0 to 8%;
    SrO in an amount of from 4 to 20%;
    BaO in an amount of from 0 to 6%;
    ZnO in an amount of from 0 to 3%;
    $Na_2O$ in an amount of from 0 to 4%; and
    $K_2O$ in an amount of from 3 to 14%,
    said glass containing $Na_2O$ and $K_2O$ in a total amount of from 3 to 15%, at least one member selected from the group consisting of $ZrO_2$, $Nb_2O_5$, $WO_3$ and $Ta_2O_5$ in an amount of from 3 to 20%, and at least one member selected from the group consisting of MgO, CaO and SrO in an amount of from 4 to 20%, in terms of % by mass.

12. The glass for semiconductor encapsulation according to claim 8, wherein $Al_2O_3/(Na_2O+K_2O)$ is 0.35 or more in terms of % by mass.

13. An outer tube for semiconductor encapsulation comprising the glass for semiconductor encapsulation according to claim 1.

14. A semiconductor electronic parts comprising:
    a semiconductor;
    a wire lead; and
    a glass for semiconductor encapsulation for covering and encapsulating a part of the semiconductor and the wire lead, said glass comprising the glass for semiconductor encapsulation according to claim 1.

15. The semiconductor electronic parts according to claim 14, wherein the semiconductor is a high-temperature type thermistor chip capable of measuring a temperature of 700° C. or higher.

* * * * *